US010638549B2

(12) United States Patent
Weber et al.

(10) Patent No.: US 10,638,549 B2
(45) Date of Patent: Apr. 28, 2020

(54) ELECTRICALLY HEATABLE PANE WITH SWITCH REGION

(71) Applicant: SAINT-GOBAIN GLASS FRANCE, Courbevoie (FR)

(72) Inventors: Patrick Weber, Alsdorf (DE); Hans-Georg Esser, Aachen (DE); Jens Bondkowski, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 499 days.

(21) Appl. No.: 15/302,972

(22) PCT Filed: Apr. 21, 2015

(86) PCT No.: PCT/EP2015/058553
§ 371 (c)(1),
(2) Date: Oct. 7, 2016

(87) PCT Pub. No.: WO2015/162108
PCT Pub. Date: Oct. 29, 2015

(65) Prior Publication Data
US 2017/0034875 A1 Feb. 2, 2017

(30) Foreign Application Priority Data
Apr. 24, 2014 (EP) .................................... 14165740

(51) Int. Cl.
H05B 3/86 (2006.01)
B32B 17/10 (2006.01)
(Continued)

(52) U.S. Cl.
CPC ......... H05B 3/86 (2013.01); B32B 17/10036 (2013.01); B32B 17/10192 (2013.01);
(Continued)

(58) Field of Classification Search
CPC ... H05B 3/84; H05B 3/86; H05B 3/06; H05B 1/0236; H05B 2203/008; H05B 2203/011;
(Continued)

(56) References Cited

U.S. PATENT DOCUMENTS 6,452,514 B1    9/2002  Philipp
7,652,226 B2 *  1/2010  Muromachi ............. H05B 3/84
                                                    219/203
(Continued)

FOREIGN PATENT DOCUMENTS

CN        1620840 A    5/2005
CN      101228098 A    7/2008
(Continued)

OTHER PUBLICATIONS

International Search Report for International Application No. PCT/EP2015/058553 dated Jul. 24, 2015. 3 pages.
(Continued)

Primary Examiner — Shawntina T Fuqua
(74) Attorney, Agent, or Firm — Pillsbury Winthrop Shaw Pittman LLP

(57) ABSTRACT

An electrically heatable pane with a switch region is presented. The pane has a transparent substrate, with at least one transparent electrically conductive layer that is, at least partially, arranged on a surface of the pane. At least one separating line electrically divides the layer into a heating region and a switch region. At least two busbars are provided for connection to a voltage source. The busbars being connected to the heating region, form a current path between the busbars. A heating current can therefore flow through the current path. Furthermore, the switch region has at least one contact region, a feed line region, and a connection region, where the connection region can be connected to sensor electronics.

23 Claims, 8 Drawing Sheets

(51) Int. Cl.
*H03K 17/96* (2006.01)
*H05B 1/02* (2006.01)
*H05B 3/06* (2006.01)
*H05B 3/84* (2006.01)

(52) U.S. Cl.
CPC ..... *B32B 17/10807* (2013.01); *H03K 17/962* (2013.01); *H05B 1/0236* (2013.01); *H05B 3/06* (2013.01); *H05B 3/84* (2013.01); *B32B 2307/202* (2013.01); *B32B 2315/08* (2013.01); *B32B 2605/006* (2013.01); *H05B 2203/008* (2013.01); *H05B 2203/011* (2013.01); *H05B 2203/013* (2013.01); *H05B 2203/017* (2013.01)

(58) Field of Classification Search
CPC ........ H05B 2203/013; H05B 2203/017; B32B 17/10192; B32B 17/10807; B32B 17/10036; B32B 2307/202; B32B 2315/08; B32B 2605/006; H03K 17/962
See application file for complete search history.

(56) References Cited

U.S. PATENT DOCUMENTS

| | | | |
|---|---|---|---|
| 2006/0275599 A1* | 12/2006 | Lefevre | B32B 17/10018 428/332 |
| 2007/0020465 A1 | 1/2007 | Thiel et al. | |
| 2007/0194216 A1* | 8/2007 | Schwenke | H05B 3/84 250/221 |

FOREIGN PATENT DOCUMENTS

| | | |
|---|---|---|
| CN | 101687392 A | 3/2010 |
| CN | 202818260 U | 3/2013 |
| DE | 202006006192 U1 | 7/2006 |
| DE | 102012018001 A1 | 5/2013 |
| EP | 0899882 A1 | 3/1999 |
| EP | 1 437 215 A1 | 7/2004 |
| EP | 1515211 A1 | 3/2005 |
| JP | 2010-521353 A | 6/2010 |
| JP | 2010-251230 A | 11/2010 |
| WO | WO 98/42163 | 9/1998 |
| WO | 2004062908 A2 | 7/2004 |
| WO | 2008113978 A1 | 9/2008 |
| WO | 2011036010 A1 | 3/2011 |
| WO | 2012052315 A1 | 4/2012 |
| WO | 2013053611 A1 | 4/2013 |
| WO | WO 2013/091961 A1 | 6/2013 |

OTHER PUBLICATIONS

International Preliminary Report on Patentability for International Application No. PCT/EP2015/058553, dated Nov. 3, 2016. English Translation + German. 18 pages.

Written Opinion for International Application No. PCT/EP2015/058553, dated Jul. 24, 2015. English Translation + German. 15 pages.

* cited by examiner

ELECTRICALLY HEATABLE PANE WITH SWITCH REGION

CROSS-REFERENCE TO RELATED APPLICATIONS

The present application is the U.S. National Stage of International Patent Application No. PCT/EP2015/058533 filed on Apr. 21, 2015 which, in turn, claims priority to European Patent Application No. 14165740.3 filed on Apr. 24, 2014.

The invention relates to an electrically heatable pane with a switch region, a pane arrangement, a method for producing the pane, and its use.

The field of vision of a motor vehicle window, in particular a windshield, must be kept free of ice and condensation. In the case of motor vehicles with an internal combustion engine, a stream of air heated by engine heat can, for example, be directed to the windows.

Alternatively, the window can have an electrical heating function. Thus, composite panes that have an electric heating layer made of a transparent, electrically conductive coating on an interior-side surface of one of the individual panes are known. Using an external voltage source, an electric current that heats the coating and, with it, the pane can be conducted through the electrically conductive coating. WO2012/052315 A1 discloses, for example, such a heatable, electrically conductive coating based on metal.

The electrical contacting of the electric heating layer is typically done via busbars, as is known from US 2007/0020465 A1. The busbars are made, for example, from a printed and fired silver paste. The busbars typically run along the upper and lower edge of the pane. The busbars collect the current that flows through the electric heating layer and conduct it to external feed lines that are connected to a voltage source. Customarily, the voltage that is applied to the electrical heating layer is controlled by an external switch that is integrated, in motor vehicles, for example, in an instrument panel. Such panes can also have multiple busbars that are connected to multiple voltage sources such that certain regions can additionally be heated, as is known from DE 10 2012 018 001 A1.

It is known that switch surfaces can be implemented by a linear or surface electrode or by an arrangement of two coupled electrodes, for example, as capacitive switch surfaces. Examples are found in US 2007/0194216 A1. When an object approaches the switch surface, the capacitance of the surface electrode changes against ground or the capacitance of the capacitor formed by the two coupled electrodes changes. The capacitance change is measured by a circuit arrangement or sensor electronics; and when a threshold value is exceeded, a switching signal is triggered. Circuit arrangements for capacitive switches are known, for example, from DE 20 2006 006 192 U1, EP 0 899 882 A1, U.S. Pat. No. 6,452,514 B1, and EP 1 515 211 A1.

The object of the present invention consists in providing an improved electrically heatable pane that has a switch region that can be integrated simply and economically into the pane, which does not interfere with vision through the pane, and has approximately uniform heating power distribution in the pane.

The object of the present invention is accomplished according to the invention by an electrically heatable pane with a switch region as described in the present disclosure.

The electrically heatable pane with a switch region according to the invention comprises at least the following characteristics:

a transparent substrate with a surface,
at least one transparent, electrically conductive layer that is arranged at least on a part of the surface,
at least one separating line that electrically divides the layer into a heating region and a switch region,
at least two busbars provided for connection to a voltage source that are connected to the heating region such that a current path for a heating current is formed between the busbars,
wherein the switch region has at least one contact region, a feed line region, and a connection region, and the connection region can be electrically connected to sensor electronics.

The feed line region electrically connects the contact region to the connection region.

The layer is electrically divided by at least one separating line into a heating region and a switch region. The switch region has three regions: a contact region, a feed line region, and a connection region. It is thus clear that the contact region, the feed line region, and the connection region are all regions of the layer. Consequently, it is understood that the contact region, the feed line region, and the connection region are all made from the material of the layer. The regions are contiguous and thus electrically conductively connected to each other such that the feed line region electrically connects the contact region to the connection region.

In an advantageous embodiment of the pane according to the invention, the longitudinal direction of the feed line region is arranged substantially in the direction of the current path of the heating current. Here, "substantially" means that the angle α between the current path and the longitudinal direction of the feed line region is from 0° to 45°, preferably from 0° to 20° and particularly preferably from 0° to 10°. This is particularly advantageous since the feed line region disrupts the current flow through the heating region only a little. If the current path and the feed line region are not straight lines, "direction of the current path" and "longitudinal direction of the feed line region" mean the respective averaged direction.

In another advantageous embodiment of the invention, the ratio of length $l_Z$ to width $b_Z$ of the feed line region is less than or equal to 1:700 and preferably from 1:1 to 1:100. If the feed line region does not have a constant width $b_Z$, for example, when it is implemented in the shape of a trapezoid or a drop, in the context of the present invention, the term "width $b_Z$" means the averaged width of the feed line region.

The length $l_Z$ of the feed line region is preferably from 1 cm to 70 cm and particularly preferably from 3 cm to 8 cm. The width $b_Z$ of the feed line region is preferably from 0.5 mm to 10 mm and particularly preferably from 0.5 mm to 2 mm. The feed line region preferably has the shape of a rectangle, a strip, or a line.

In an advantageous embodiment of the pane according to the invention, the connection region is arranged on the outer edge of the pane and/or adjacent one of the busbars. The distance to the outer edge or to the nearest busbar is preferably less than 10 cm, particularly preferably less than 0.5 cm. This enables concealing an electrical contacting of the connection region, for example, to a foil conductor, under an optically inconspicuous black imprint or with a covering, for example, a camera housing.

In an advantageous embodiment of the switch region according to the invention, the contact region has an area from 1 cm² to 200 cm², particularly preferably from 1 cm² to 9 cm². The length $l_B$ of the contact region is preferably from 1 cm to 14 cm and particularly preferably from 1 cm to 3 cm. The maximum width $b_B$ of the contact region is preferably from 1 cm to 14 cm and particularly preferably from 1 cm to 3 cm. The contact region can, in principle, have any shape. Particularly suitable are shapes that enable good diversion of the current flow of the heating current around the contact surface. Particularly suitable contact regions are implemented circular, elliptical, or drop-shaped. Alternatively, angular shapes are possible, for example, triangles, squares, rectangles, trapezoids, or other types of quadrangles or polygons of a higher order. Generally speaking, it is particularly advantageous for any corners to be rounded. This is true for all regions of the switch region, in particular in the transition region between the contact region and the feed line region and/or the feed line region and the connection region. It is particularly advantageous for the corners to have a radius of curvature of at least 3 mm, preferably of at least 8 mm.

In another advantageous embodiment of the switch region according to the invention, the ratio of the width $b_Z$ of the feed line region to the maximum width $b_B$ of the contact region is at least 1:2 and in particular at least 1:10. Thus, it was possible to obtain particularly good switching results.

In an advantageous embodiment of the pane according to the invention, the width d of the separating lines is from 30 µm to 200 µm and preferably from 70 µm to 140 µm. Such thin separating lines enable reliable and adequately high electrical isolation and, at the same time, interfere with vision through the pane only slightly or not at all.

Another advantageous embodiment of the pane according to the invention comprises a pane, in which the surface of the substrate having the electrically conductive layer is connected areally to a cover pane via a thermoplastic intermediate layer. This has the advantage that the switch region and the heating region are hermetically sealed in the interior of the composite pane and thus protected from direct contact and corrosion.

The switch region is preferably a capacitive switch region. In an advantageous embodiment, the switch region forms a surface electrode. The capacitance of the surface electrode is measured via external capacitance sensor electronics. The capacitance of the surface electrode changes against ground if a grounded object comes into its proximity or, for example, touches an insulator layer above the surface electrode. The insulator layer comprises in particular the substrate itself or an intermediate layer or a cover pane. The capacitance change is measured by the sensor electronics; and when a threshold value is exceeded, a switching signal is triggered. The switch region is defined by the shape and size of the surface electrode.

In an alternative embodiment of a pane according to the invention, the electrically conductive layer has at least one additional separating line that electrically divides the electrically conductive layer into a surrounding region of the switch region. It is particularly advantageous if the surrounding region surrounds the switch region at least partially and preferably completely. Such a surrounding region is advantageous, since the influence of the heating region and in particular a voltage change in the heating region on the switch region is reduced.

In another advantageous embodiment of the pane according to the invention, the surrounding region has a similar shape or the same shape as the switch region. In particular, circular, elliptical, or drop shapes or shapes with rounded corners as well as strip shapes are especially advantageous since with them the heating current is particularly advantageously diverted around the surrounding region and no or only few local hotspots occur.

A surrounding region according to the invention preferably has a distance less than or equal to 20 mm from the separating line that delimits the switch region, particularly preferably from 5 mm to 15 mm. The switch region can thus be particularly well shielded from the heating region.

It is particularly advantageous for the surrounding region to have an additional connection region that can be connected to the sensor electronics.

In such an arrangement, the switch region and the surrounding region form two electrodes that are capacitively coupled to each other. The capacitance of the capacitor formed by the electrodes is altered by the approach of an object, for example, a human body part. The capacitance change is measured by sensor electronics; and when a threshold value is exceeded, a switching signal is triggered. The sensitive region is defined by the shape and size of the region in which the electrodes are capacitively coupled.

Alternatively, the switch region can also have inductive, thermal, or all other sensor functions that are contact free. "Contact free" means that no direct contact of the electrically conductive structure is necessary for the triggering of a switching operation. It is understood that the switching function is also active with direct contact of the electrically conductive structure if the electrically conductive structure is accessible to the user. In principle, switch regions with contact-dependent sensor functions can also be implemented.

The switch region and, optionally, the surrounding region are integrated into the pane according to the invention. Thus, no switch is necessary as a separate component that must be mounted on the pane. The pane according to the invention, which can be implemented as a single pane or as a composite pane, preferably also has no other components that are arranged on its surface in the see-through region. This is particularly advantageous with regard to thin construction of the pane as well as only slight interference with vision through the pane.

An advantageous aspect of the invention comprises a pane arrangement with a pane according to the invention and sensor electronics that are electrically connected to the switch surface and, optionally, to the surrounding surface via the connection region. The sensor electronics are preferably capacitive sensor electronics.

In an advantageous embodiment of the circuit arrangement according to the invention, the sensitivity of the sensor electronics is selected such that the sensor electronics issue a switching signal when the contact region is touched by a human finger on the substrate and issue no switching signal or a different switching signal when the contact region is touched on the cover pane. Of course, the contacting of the contact region can also be done with multiple fingers or with a different part of the human body. In the context of this invention, "contacting" means any interaction with the switch region that results in a measurable change in the measurement signal, for example, the capacitance. In particular, this is direct contacting of the switch region or contacting through an insulator, for example, through the thickness of the substrate or the thickness of the intermediate layer or the thickness of the intermediate pane and the cover pane.

These switching signals issued can be of any type and adapted to the requirements of the respective use. Thus, the switching signal can mean a positive voltage, for example, 12 V, can mean no switching signal, for example, 0 V, and can mean another switching signal, for example, +6. The switching signals can also correspond to the voltages CAN_High and CAN_Low customary with a CAN bus and change by a voltage value between them. The switching signal can also be pulsed and/or digitally coded.

The sensitivity of the sensor electronics can be determined as a function of the size of the contact region and as a function of the thickness of the substrate, intermediate layers, and cover pane in the context of simple experiments. In particular, an intermediate layer with a permittivity number from 2 to 4 and preferably a minimum thickness of 0.5 mm yields a clear difference in the capacitance change between contacting the contact surface via the substrate in comparison with contacting via the cover pane. It is particularly advantageous for the cover pane to have the same or a greater thickness than the substrate.

The particular advantage of such a pane arrangement according to the invention resides in that the switching signal can be triggered only through contacting the pane from one side. In the case of use of the pane arrangement in a motor vehicle window and installation of the pane with the substrate side in the direction of the vehicle interior, it is possible, for example, to reliably prevent triggering the switching operation from the outside by individuals or an unwanted triggering of the switching operation by rain or the movement of the windshield wiper. This was unexpected and surprising for the person skilled in the art.

In combination with the just described pane arrangement or alternatively thereto, the sensitivity of the sensor electronics can be selected such that a switching signal is issued when the contact region on the substrate and/or the cover pane is touched by a human finger and no switching signal or a different switching signal is issued when the feedline region on the substrate and/or the cover pane is touched.

The sensitivity of the sensor electronics can be determined as a function of the size of the contact region and as a function of the geometry as well as the aspect ratio between width and length of the feedline region in the context of simple experiments. It is particularly advantageous for the width of the feedline region to be selected as small as possible.

The particular advantage of this embodiment of a pane arrangement according to the invention resides in the fact that the switching signal can be triggered only by touching the contact region or its immediate surroundings and, thus, precise control of the switching operation is possible, and, for example, inadvertent switching is prevented.

In an advantageous improvement of a pane arrangement according to the invention, the connection region is connected to a flat conductor and the flat conductor is guided out of the pane. The integrated pane arrangement can then be particularly simply connected, at the place of use, to a voltage source and to a signal line that evaluates the switching signal of the sensor circuit, for example, in a vehicle via a CAN bus.

The busbars are preferably arranged along the lateral edge of the electrically conductive layer. The length of the busbar is typically substantially equal to the length of the lateral edge of the electrically conductive layer; however, it can also be slightly larger or smaller. Even more than two busbars can be arranged on the electrically conductive layer, preferably in the edge region along two opposing lateral edges of the electrically conductive layer. Even more than two busbars can be arranged on the electrically conductive layer, for example, in order to form two or more independent heating regions in one layer or when the busbar is interrupted or displaced by one or a plurality of uncoated zones such as communication windows. The teaching according to the invention then applies to at least one and preferably to each of the independent heating regions.

In an advantageous embodiment, the busbar according to the invention is implemented as a printed and fired conductive structure. The printed busbar preferably contains at least one metal, one metal alloy, one metal compound, and/or carbon, particularly preferably one noble metal and, in particular, silver. The printing paste preferably contains metallic particles, metal particles, and/or carbon and, in particular noble metal particles such as silver particles. The electrical conductivity is preferably achieved by means of the electrically conductive particles. The particles can be situated in an organic and/or inorganic matrix such as pastes or inks, preferably as printing paste with glass frits.

The width of the first and second busbar is preferably from 2 mm to 30 mm, particularly preferably from 4 mm to 20 mm and in particular from 10 mm to 20 mm. Thinner busbars result in excessively high electrical resistance and thus in excessively high heating of the busbar during operation. Moreover, thinner busbars are relatively difficult to produce by printing techniques such as screenprinting. Thicker busbars require undesirably high use of material. Moreover, they result in excessively great and inaesthetic limitation of the see-through region of the pane. The length of the busbar is governed by the extent of the heating region. In the case of a busbar that is typically implemented in the shape of a strip, the longer of its dimensions is referred to as "length" and the less long of its dimensions is referred to as "width". The third or additional busbars can be configured even thinner, preferably from 0.6 mm to 5 mm.

The layer thickness of the printed busbar is preferably from 5 µm to 40 µm, particularly preferably from 8 µm to 20 µm and most particularly preferably from 8 µm to 12 µm. Printed busbars with these thicknesses are technically simple to realize and have advantageous current-carrying capacity.

The specific resistance $\rho_a$ of the busbars is preferably from 0.8 µohm·cm to 7.0 µohm·cm and particularly preferably from 1.0 µohm·cm to 2.5 µohm·cm. Busbars with specific resistances in this range are technically simple to realize and have advantageous current-carrying capacity.

Alternatively, however, the busbar can also be implemented as a strip of an electrically conductive foil. The busbar then contains, for example, at least aluminum, copper, tinned copper, gold, silver, zinc, tungsten, and/or tin or alloys thereof. The strip preferably has a thickness from 10 µm to 500 µm, particularly preferably from 30 µm to 300 µm. Busbars made of electrically conductive foils with these thicknesses are technically simple to realize and have advantageous current-carrying capacity. The strip can be electrically conductively connected to the electrically conductive structure, for example, via a soldering compound, via an electrically conductive adhesive, or by direct placement with pressure applied.

The pane according to the invention includes a substrate, on which a heatable electrically conductive layer is arranged. Depending on the type of layer, it is advantageous to protect the layer with a protective layer, for example, a paint, a polymeric film, and/or a cover pane.

In an advantageous embodiment of the pane according to the invention, the surface of the substrate on which the transparent, electrically conductive layer is arranged is areally bonded to a cover pane via a thermoplastic intermediate layer.

In principle, all electrically insulating substrates that are thermally and chemically stable as well as dimensionally stable under the conditions of production and use of the pane according to the invention are suitable as the substrate and, optionally, the cover pane.

The substrate and/or the cover pane preferably contain glass, particularly preferably flat glass, float glass, quartz glass, borosilicate glass, soda lime glass, or clear plastics, preferably rigid clear plastics, in particular polyethylene, polypropylene, polycarbonate, polymethyl methacrylate, polystyrene, polyamide, polyesters, polyvinyl chloride, and/or mixtures thereof. The substrate and/or the cover pane are preferably transparent, in particular for the use of the pane as a windshield or rear window of a vehicle or other uses where high light transmittance is desired. In the context of the invention, "transparent" means a pane that has transmittance greater than 70% in the visible spectral range. However, for panes that are not situated in the traffic-relevant field of view of the driver, for example, for roof panels, the transmittance can also be much lower, for example, greater than 5%.

The thickness of the substrate and/or cover pane can vary widely and thus be eminently adapted to the requirements of the individual case. Preferably, standard thicknesses from 1.0 mm to 25 mm, preferably from 1.4 mm to 2.5 mm are used for motor vehicle glass and, preferably, from 4 mm to 25 mm for furniture, devices, and buildings, in particular for electric heaters. The size of the pane can vary widely and is governed by the size of the use according to the invention. In motor vehicle engineering and the architectural sector, the substrate and, optionally, the cover pane have, for example, customary areas of 200 cm$^2$ up to 20 m$^2$.

The pane can have any three-dimensional shape. Preferably, the three-dimensional shape has no shadow zones such that it can, for example, be coated by cathodic sputtering. Preferably, the substrates are planar or slightly or greatly curved in one or a plurality of spatial directions. In particular, planar substrates are used. The panes can be colorless or colored.

Multiple substrates and/or cover panes are bonded to each other by at least one intermediate layer. The intermediate layer preferably contains at least one thermoplastic plastic, preferably polyvinyl butyral (PVB), ethylene vinyl acetate (EVA), and/or polyethylene terephthalate (PET). The thermoplastic intermediate layer can, however, also contain, for example, polyurethane (PU), polypropylene (PP), polyacrylate, polyethylene (PE), polycarbonate (PC), polymethyl methacrylate, polyvinyl chloride, poly acetate resin, casting resins, acrylates, fluorinated ethylene propylenes, polyvinyl fluoride, and/or ethylene tetrafluoroethylene, or copolymers or mixtures thereof. The thermoplastic intermediate layer can be formed by one or even a plurality of thermoplastic films arranged one over another, with the thickness of a thermoplastic film preferably being from 0.25 mm to 1 mm, typically 0.38 mm or 0.76 mm.

In a composite pane according to the invention made of a substrate, an intermediate layer, and a cover pane, the transparent, electrically conductive layer can be applied directly on the substrate or on a carrier film or on the intermediate layer itself. The substrate and the cover pane have in each case an interior-side surface and an exterior-side surface. The interior-side surfaces of the substrate and of the cover pane face each other and are bonded to each other via the thermoplastic intermediate layer. The exterior-side surfaces of the substrate and of the cover pane face away from each other and away from the thermoplastic intermediate layer. The transparent, electrically conductive layer is preferably applied on the interior-side surface of the substrate. Of course, an additional electrically conductive coating can be applied on the interior-side surface of the cover pane. The exterior-side surfaces of the panes can also have coatings. The terms "substrate" and "cover pane" are selected to distinguish between the two panes in a composite pane according to the invention. No statement concerning the geometric arrangement is associated with the terms. If, for example, the pane according to the invention is provided in an opening, for example, of a motor vehicle or a building, to separate the interior from the external environment, the substrate can face the interior or the external environment.

The electrically conductive layer preferably contains a transparent, electrically conductive coating. Here, "transparent" means permeable to electromagnetic radiation, preferably electromagnetic radiation of a wavelength from 300 nm to 1,300 nm and in particular to visible light.

Electrically conductive layers according to the invention are known, for example, from DE 20 2008 017 611 U1, EP 0 847 965 B1, or WO2012/052315 A1. They typically contain one or a plurality, for example, two, three, or four electrically conductive, functional layers. The functional layers preferably contain at least one metal, for example, silver, gold, copper, nickel, and/or chromium, or a metal alloy. The functional layers particularly preferably contain at least 90 wt.-% of the metal, in particular at least 99.9 wt.-% of the metal. The functional layers can be made of the metal or of the metal alloy. The functional layers particularly preferably contain silver or a silver-containing alloy. Such functional layers have particularly advantageous electrical conductivity with, at the same time, high transmittance in the visible spectral range. The thickness of a functional layer is preferably from 5 nm to 50 nm, particularly preferably from 8 nm to 25 nm. In this range for the thickness of the functional layer, advantageously high transmittance in the visible spectral range and particularly advantageous electrical conductivity are obtained.

Typically, at least one dielectric layer is arranged, in each case, between two adjacent functional layers. Preferably, an additional dielectric layer is arranged below the first and/or above the last functional layer. A dielectric layer includes at least one individual layer made of a dielectric material, for example, containing a nitride such as silicon nitride or an oxide such as aluminum oxide. However, a dielectric layer can also include a plurality of individual layers, for example, individual layers of a dielectric material, smoothing layers, adaptation layers, blocker layers, and/or anti-reflexion layers. The thickness of a dielectric layer is, for example, from 10 nm to 200 nm.

This layer structure is, in general, obtained by a sequence of deposition procedures that are performed by a vacuum method such as magnetically enhanced cathodic sputtering.

Other suitable electrically conductive layers preferably contain indium tin oxide (ITO), fluorine-doped tin oxide ($SnO_2$:F), or aluminum-doped zinc oxide (ZnO:Al).

The electrically conductive layer can, in principle, be any coating that can be electrically contacted. If the pane according to the invention is intended to enable vision through it, as is, for example, the case in panes in the window sector, the electrically conductive layer is preferably transparent. In an advantageous embodiment, the electrically conductive layer is a layer or a layer structure of multiple individual layers with a total thickness less than or equal to 2 µm, particularly preferably less than or equal to 1 µm.

An advantageous electrically conductive layer according to the invention has sheet resistance of 0.4 ohm/square to 10 ohm/square. In a particularly preferred embodiment, the electrically conductive layer according to the invention has sheet resistance of 0.5 ohm/square to 1 ohm/square. Coatings with such sheet resistances from 12 V to 48 V or in the case of electric vehicles with typical onboard voltages of up to 500 V.

The electrically conductive layer can extend over the entire surface of the substrate. However, alternatively, the electrically conductive layer can also extend over only a part of the surface of the substrate. The electrically conductive layer preferably extends over at least 50%, particularly preferably over at least 70%, and most particularly preferably over at least 90% of the interior-side surface of the substrate. The electrically conductive layer can have one or a plurality of uncoated zones. These zones can be transparent to electromagnetic radiation and are known, for example, as data transmission windows or communication windows.

In an advantageous embodiment of a pane according to the invention as a composite pane, the interior-side surface of the substrate has a circumferential edge region with a width from 2 mm to 50 mm, preferably from 5 mm to 20 mm, which is not provided with the electrically conductive layer. The electrically conductive layer in this case has no contact with the atmosphere and is advantageously protected in the interior of the pane by the thermoplastic intermediate layer against damage and corrosion.

The electrical feed line is preferably implemented as a foil conductor or a flexible foil conductor (flat conductor, ribbon conductor). This applies both to the feed lines of the busbars of the heating region and to the feed lines of the switch region that are connected to the connection region or regions. The term "foil conductor" means an electrical conductor whose width is clearly greater than its thickness. Such a foil conductor is, for example, a strip or band containing or made of copper, tinned copper, aluminum, silver, gold, or alloys thereof. The foil conductor has, for example, a width of 2 mm to 16 mm and a thickness of 0.03 mm to 0.1 mm. The foil conductor can have an insulating, preferably polymeric sheathing, for example, based on polyimide. Foil conductors that are suitable for the contacting of electrically conductive coatings in panes have a total thickness of, for example, merely 0.3 mm. Such thin foil conductors can be embedded without difficulty between the individual panes in the thermoplastic intermediate layer. Multiple conductive layers electrically insulated from each other can be situated in a foil conductor strip.

Alternatively, thin metal wires can also be used as an electrical feed line. The metal wires contain in particular copper, tungsten, gold, silver, or aluminum or alloys of at least two of these metals. The alloys can also contain molybdenum, rhenium, osmium, iridium, palladium, or platinum.

In an advantageous embodiment of the invention, the electrical feed line is connected to the busbars by a contact strip, for example, by means of a soldering compound or an electrically conductive adhesive. The contact strip is then connected to the busbar. The contact strip advantageously increases the current-carrying capacity of the busbar. Also, undesirable heating of the contact point between the busbar and the feed line can be reduced by the contact strip. In addition, the contact strip simplifies the electrical contacting of the busbar by the electrical feed line since the feed line does not have to be connected, for example, soldered, to the already applied busbar.

The contact strip preferably contains at least one metal, particularly preferably copper, tinned copper, silver, gold, aluminum, zinc, tungsten, and/or tin. This is particularly advantageous with regard to the electrical conductivity of the contact strip. The contact strip can also include alloys which preferably contain one or a plurality of the elements mentioned and, optionally, other elements, for example, brass or bronze. The contact strip can simply be placed on the busbars and is durably stably fixed at the intended position within the laminated pane.

In an advantageous embodiment of the invention, the pane according to the invention has a light irradiation means and a light deflection means. Light irradiation means and light deflection means are arranged in or on the substrate and/or on the cover pane. The switch region can be arranged on the same surface of the substrate as the light deflection means. The electrically conductive layer with the switch region can be arranged out of the direction of the substrate above or below the light deflection means or in the same plane as the light deflection means. Alternatively, the electrically conductive layer and the light deflection means can be arranged on the opposite surfaces of the substrate.

According to the invention, the light irradiation means comprises at least one light source, preferably an LED or OLED. The particular advantage resides in the small dimensions and the low power consumption. The wavelength range emitted by the light source can be selected freely in the range of visible light, for example, based on practical and/or aesthetic considerations. The light irradiation means can include optical elements, in particular for deflecting the light, preferably a reflector and/or a light waveguide, for example, a glass fiber or a polymeric optical fiber. The light irradiation means can be arranged at any location on the substrate or the cover pane, in particular on the lateral edge of the substrate or of the cover pane or in a small recess in the middle of the substrate or cover pane.

The light deflection means preferably includes particles, dot grids, stickers, deposits, notches, incisions, line grids, imprints, and/or screen prints and is suitable to decouple the light transported in the substrate or in the cover pane therefrom.

The light deflection means can be arranged at any position on the level of the substrate or the cover pane. It is particularly advantageous for the light deflection means to be arranged in the region of or in the immediate surroundings of the contact region and thus to enable rapid finding of the otherwise hardly visible contact region. This is particularly advantageous at night or in darkness.

Alternatively, light can be guided to the switch region by a waveguide that is arranged on the transparent substrate, the intermediate layer, or the cover pane and can mark the switch region.

Alternatively or in combination, the light irradiation means together with the light deflection means can visualize data on the pane, for example, report or display the switching state of the capacitive switch region, whether the electrical heating of the pane is switched on or switched off.

In an alternative advantageous embodiment of the pane according to the invention, the contact region is directly markable or marked by an active light source, preferably by a light emitting diode (LED), an organic light emitting diode (OLED), an incandescent light bulb, or other active luminary, such as a luminescent material, preferably a florescent or phosphorescent material.

In another alternative advantageous embodiment of the pane according to the invention, the switch region is marked by a colored, preferably a white or black, imprint, for example, a screenprint, on the transparent substrate, the intermediate layer, or the cover pane. This has the particular advantage that the switch region is marked durably and independently of a voltage source. The imprint can also contain a luminescent material, preferably a florescent or phosphorescent material and/or be luminescent.

The invention further comprises a method for producing an electrically heatable pane with a switch region, comprising at least:

(a) application of the transparent, electrically conductive layer on a surface (III) of a transparent substrate, (b) introduction of at least one separating line that electrically divides the layer into at least one heating region and one switch region, (c) application of at least two busbars provided for connection to a voltage source that are connected to the layer such that a current path for a heating current is formed between the busbars.

It is understood that the process steps b) and c) can also occur in reverse order such that, first, the busbars are arranged on the electrically conductive layer and, after that, the separating lines are introduced into the electrically conductive layer.

The application of the electrically conductive layer in process step (a) can be done by methods known per se, preferably by magnetically enhanced cathodic sputtering. This is particularly advantageous with regard to simple, quick, economical, and uniform coating of the substrate. However, the electrically conductive layer can also be applied, for example, by vapor deposition, chemical vapor deposition (CVD), plasma-enhanced chemical vapor deposition (PECVD), or by wet chemical processes.

The substrate can be subjected to a temperature treatment after process step (a). The substrate is heated along with the electrically conductive layer to a temperature of at least 200° C., preferably at least 300° C. The temperature treatment can also serve to increase transmittance and/or to reduce the sheet resistance of the electrically conductive layer.

After the process step (a), the substrate can be bent, typically at a temperature from 500° C. to 700° C. Since it is technically simpler to coat a flat pane, this procedure is advantageous if the substrate is to be bent. Alternatively, however, the substrate can also be bent before process step (a), for example, if the electrically conductive layer is not suited to withstand a bending process without damage.

The application of the busbar in process step (b) is preferably done by printing and firing an electrically conductive paste in a silkscreen printing process or in an ink-jet process. Alternatively, the busbar can be applied as a strip of an electrically conductive foil onto the electrically conductive layer, preferably applied with contact pressure, soldered, or glued on.

In the case of silkscreen printing methods, the lateral shaping is done by masking the fabric through which the printing paste with the metal particles is pressed. By means of appropriate shaping of the masking, it is, for example, possible to predefine and to vary the width b of the busbar in a particularly simple manner.

The de-coating of individual separating lines in the electrically conductive layer is preferably done using a laser beam. Methods for patterning thin metal foils are known, for example, from EP 2 200 097 A1 or EP 2 139 049 A1. The width of the de-coating is preferably 10 μm to 1000 μm, particularly preferably 30 μm to 200 μm, and in particular 70 μm to 140 μm. In this range, a particularly clean and residue-free de-coating takes place using the laser beam. Laser-beam de-coating is particularly advantageous since the de-coated lines are visually quite inconspicuous and only little impair the appearance and the vision through the pane. The de-coating of a line with a width that is wider than the width of a laser incision is done by repeated tracing of the line with the laser beam. Consequently, the processing time and the processing costs increase with increasing line width.

Alternatively, the de-coating can be done by mechanical ablation as well as by chemical or physical etching.

An advantageous improvement of the method according to the invention includes at least the following additional steps:

(d) arranging a thermoplastic intermediate layer on the coated surface of the substrate and arranging a cover pane on the thermoplastic thermoplastischen intermediate layer, and (e) bonding the substrate to the cover pane via the thermoplastic intermediate layer.

In process step (d), the substrate is arranged such that the one of its surfaces that is provided with the electrically conductive layer faces the thermoplastic intermediate layer. The surface thus becomes the interior-side surface of the substrate.

The thermoplastic intermediate layer can be formed by one individual thermoplastic film or also by two or more thermoplastic films that are arranged areally one above another.

The bonding of the substrate and the cover pane in process step (e) is preferably done under the action of heat, vacuum, and/or pressure. Methods known per se for producing a pane can be used.

For example, so-called "autoclave methods" can be performed at an elevated pressure of roughly 10 bar to 15 bar and temperatures from 130° C. to 145° C. for roughly 2 hours. Vacuum bag or vacuum ring methods known per se operate, for example, at roughly 200 mbar and 80° C. to 110° C. The first pane, the thermoplastic intermediate layer, and the second pane can also be pressed in a calender between at least one pair of rollers to form a pane. Systems of this type for producing panes are known and normally have at least one heating tunnel upstream from a pressing unit. The temperature during the pressing operation is, for example, from 40° C. to 150° C. Combinations of calender and autoclave methods have proved particularly valuable in practice. Alternatively, vacuum laminators can be used. These consist of one or a plurality of heatable and evacuable chambers, in which the first pane and the second pane are laminated within, for example, roughly 60 minutes at reduced pressures from 0.01 mbar to 800 mbar and temperatures from 80° C. to 170° C.

The invention further includes the use of the electrically heatable pane with a switch region according to the invention in buildings, in particular in the access area, window area, roof area, or façade area, as a built-in component in furniture and devices, in means of transportation for travel on land, in the air, or on water, in particular in trains, watercraft, and automobiles, for example, as a windshield, rear window, side window, and/or roof panel.

The invention further includes the use of the switch region of the electrically heatable pane according to the invention for controlling and, in particular, for switching the heating function of the pane on and off in the heating region.

In the following, the invention is explained in detail with reference to drawings and exemplary embodiments. The drawings are schematic depictions and not true to scale. The drawings in no way restrict the invention.

They depict:

FIG. 1A a top plan view of an embodiment of a pane arrangement according to the invention with a pane according to the invention, FIG. 1B an enlarged view of the detail Z of FIG. 1A, FIG. 1C a cross-sectional view along the cutting line A-A' of FIG. 1A, FIG. 1D another view of the detail Z of FIG. 1A, FIG. 2A an alternative embodiment of a pane according to the invention in an enlarged view of the detail Z of FIG. 1A, FIG. 2B a cross-sectional view along the cutting line B-B' of FIG. 2A, FIG. 3 another alternative embodiment of the pane according to the invention in an enlarged view of the detail Z of FIG. 1A, FIG. 4A a top plan view of an alternative embodiment of the pane according to the invention, FIG. 4B an enlarged view of the detail Z of FIG. 4A, FIG. 4C a cross-sectional view along the cutting line C-C' of FIG. 4A, FIG. 5 a detailed flow chart of an embodiment of the method according to the invention.

FIG. 1A depicts a top plan view of an exemplary embodiment of a pane arrangement 101 according to the invention with a pane 100 according to the invention. The pane 100 includes a substrate 1 and is made, for example, of soda lime glass. An electrically conductive layer 2 is applied on a surface III of the substrate 1. The electrically conductive layer 2 is a layer system, which includes, for example, three electrically conductive silver layers that are separated from each other by dielectric layers. When a current flows through the electrically conductive layer 2, it is heated as a result of its electrical resistance and Joule heat generation. Consequently, the electrically conductive layer 2 can be used for active heating of the pane 100. The dimensions of the pane 100 are, for example, 0.9 m×1.5 m.

The electrically conductive layer 2 is divided by a separating line 4.1 into a heating region 3 and a switch region 10. In other words, both the heating region 3 and the switch region 10 are made from the electrically conductive layer 2, but are electrically isolated from each other by the separating line 4.1. The separating line 4.1 has a width $d_1$ of, for example, only 100 μm and is, for example, introduced into the electrically conductive layer 2 by laser patterning. Separating lines 4.1 with such a small width are optically hardly perceptible and disrupt vision through the pane 100 only little, which is, especially for use in motor vehicles, of particular importance for driving safety.

For the electrical contacting of the heating region 3, a first busbar 5.1 is arranged in the lower edge region and another second busbar 5.2 is arranged respectively in the upper edge region of the heating region 3. The busbars 5.1, 5.2 contain, for example, silver particles and were applied in the screen-printing method and subsequently fired. The length of the busbars 5.1, 5.2 corresponds approx. to the dimension of the electrically conductive layer 2. The two busbars 5.1, 5.2 run approx. parallel.

FIG. 1B depicts an enlarged view of the detail Z of FIG. 1A. The switch region comprises a contact region 11, which is implemented approx. drop-shaped and transitions into a feed line region 12. Here, "drop-shaped" means that contact region 11 is substantially circular and tapers funnel-like on one side toward the feed line region 12. The width $b_B$ of the contact region 11 is, for example, 40 mm. The width $b_Z$ of the feed line region 12 is, for example, 1 mm. The ratio $b_Z:b_B$ is thus roughly 1:40. The feed line region 12 is connected to a connection region 13. The connection region 13 has a square shape with rounded corners and a side length $b_A$ of, for example, 12 mm. The length $l_Z$ of the feed line region is roughly 48 mm.

The connection region 13 is electrically conductively connected via an electrical line connection 20 to a foil conductor 17. The foil conductor 17 consists, for example, of a 50 μm thick copper foil and is, for example, insulated outside the connection region 13 with a polyimide layer. Thus, the foil conductor 17 can be guided out beyond the busbar 5.2 over the upper edge of the pane 100 without an electrical short circuit. Of course the electrical connection of the connection region to the outside can also be guided outward via insulated wires or via a region, in which the busbar 5.2 is interrupted.

Here, the foil conductor 17 is, for example, connected outside the pane 100 to capacitive sensor electronics that measure the capacitance changes of the switch region 10 against "ground" and, as a function of a threshold value, forwards a switch signal via the connection point 19, for example, to the CAN bus of a motor vehicle. Any functions in the motor vehicle, for example, even the voltage source 6 and, thus, the electrical heating of the pane 100 via the heating region 3, can be switched via the switch signal.

FIG. 1C is a cross-sectional view along the cutting line A-A' of FIG. 1A.

Here, the pane 100 comprises, for example, a substrate 1 and a cover pane 9 that are bonded to each other via a thermoplastic intermediate layer 8. The pane 100 is, for example, a motor vehicle window and, in particular, the windshield of a passenger car. The substrate 1 is, for example, intended to face the interior in the installed position. In other words, the side IV of the substrate 1 is accessible from the interior out, whereas side I of the cover pane faces outward. Substrate 1 and cover pane 9 are made, for example, of soda lime glass. The thickness of the substrate 1 is, for example, 1.6 mm and the thickness of the cover pane 9 is 2.1 mm. Of course, the substrate 1 and the cover pane 9 can have any thicknesses and can, for example, even be implemented with the same thickness. The thermoplastic intermediate layer 8 is made of polyvinyl butyral (PVB) and has a thickness of 0.76 mm. The electrically conductive layer 2 is applied on the interior-side surface III of the substrate 1.

The electrically conductive layer 2 extends, for example, over the entire surface III of the substrate 1 minus a circumferential frame-like uncoated region with a width of 8 mm. The uncoated region serves for electrical insulation between the voltage-carrying electrically conductive layer 2 and the motor vehicle body. The uncoated region is hermetically sealed by gluing to the intermediate layer 8 in order to protect the electrically conductive layer 2 against damage and corrosion.

For the electrical contacting of the heating region 3 of the electrically conductive layer 2, a first busbar 5.1 is arranged in the lower edge region and an additional, second busbar 5.2 is arranged respectively in the upper edge region on the electrically conductive layer 2. The busbars 5.1, 5.2 contain, for example, silver particles and were applied by the screen printing method and subsequently fired. The length of the busbars 5.1, 5.2 corresponds approximately to the dimension of the heating region 3.

When an electrical voltage is applied to the busbars 5.1 and 5.2, a uniform current flows through the electrically conductive layer 2 of the heating region 3 between the busbars 5.1, 5.2. In roughly the center of each busbar 5.1, 5.2, a foil conductor 17 is arranged. The foil conductor 17 is electrically conductively connected to the busbar 5.1, 5.2 via a contact surface, for example, by means of a soldering compound, an electrically conductive adhesive, or by simple placement and contact pressure within pane 100. The foil conductor 17 contains, for example, a tinned copper foil with a width of 10 mm and a thickness of 0.3 mm. The busbars 5.1, 5.2 are connected via the foil conductor 17 via feed lines 18 to a voltage source 6, which provides onboard voltage customary for motor vehicles, preferably from 12 V to 15 V and, for example, roughly 14 V. Alternatively, the voltage source 6 can also have higher voltages, for example, from 35 V to 45 V and, in particular, 42 V.

The busbars 5.1,5.2 have, in the example depicted, a constant thickness of, for example, roughly 10 μm and a constant specific resistance of, for example, 2.3 μohm·cm.

FIG. 1D depicts another view of the detail Z of FIG. 1A, in which the center current path 7 in the surrounding of the switch region 10 is depicted. The longitudinal direction of the feed line region 12 (depicted here by a parallel dash line 21) has an angle α of, for example, 0.5° relative to the direction of the current path 7. Thus, the flow of current of the heating current upon application of a voltage to the busbars 5.1,5.2 is only slightly disrupted by the feed line region 12. The feed line region 12 can, consequently, be selected any length without the course of the heating current being appreciably disrupted and without local overheating areas, so-called "hotspots", occurring on the pane 100.

When the pane 100 is used, for example, as a windshield in a motor vehicle, the length of the feed line region 12 can be selected such that the driver of the motor vehicle or the front seat passenger can conveniently reach the contact region 11 of the switch region 10.

FIG. 2A depicts an alternative embodiment of the pane 100 according to the invention in an enlarged view of the detail Z of FIG. 1A. The switch region 10 comprises a contact region 11, which is implemented approx. square, where the corners are implemented rounded and have a radius of curvature r of roughly 4 mm. The contact region 11 transitions into a feed line region 12. The width $b_B$ and the length $l_B$ of the contact region 11 is, for example, 40 mm. The width $b_Z$ of the feed line region 12 is, for example, 1 mm. The feed line region 12 is connected to a connection region 13. The connection region 13 has a square shape with rounded corners and a side length $b_A$ of, for example, 12 mm. The remaining structure of the pane 100 corresponds, for example, to the structure of the pane 100 of FIG. 1A.

Figure 1A:
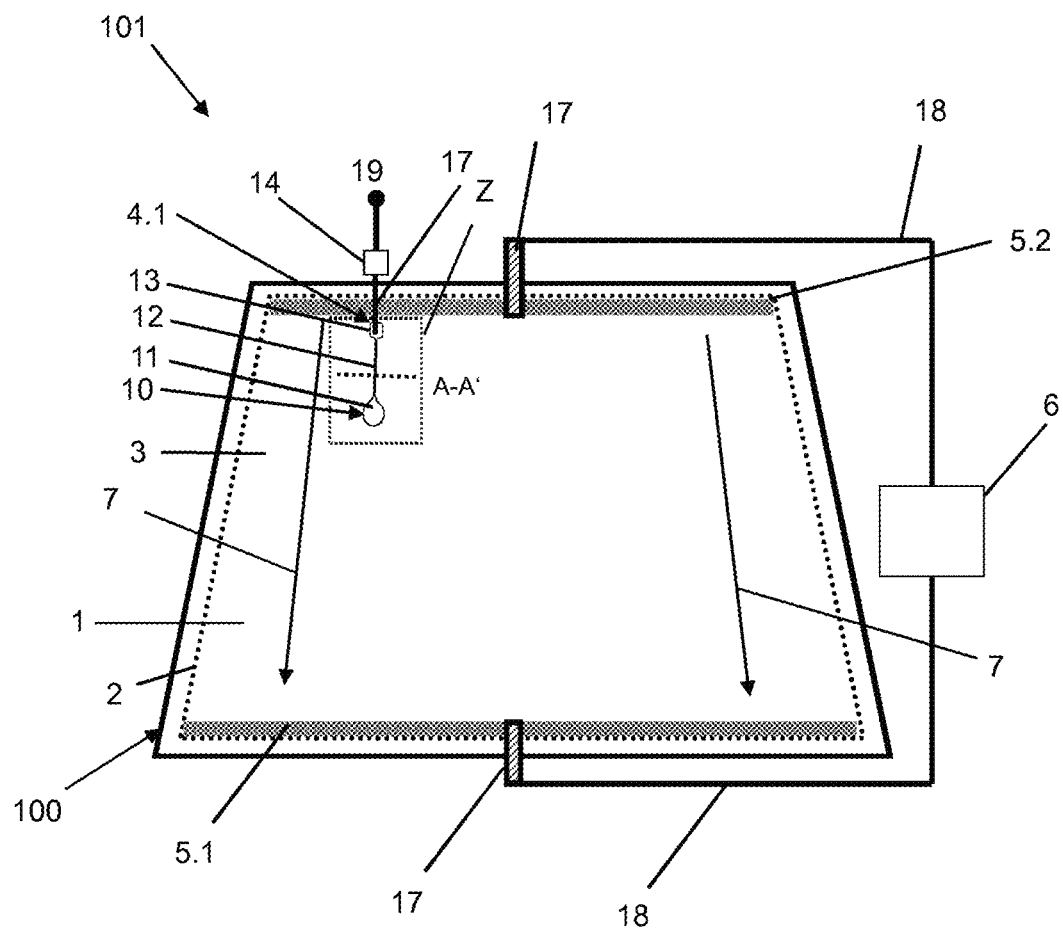
Figure 1B:
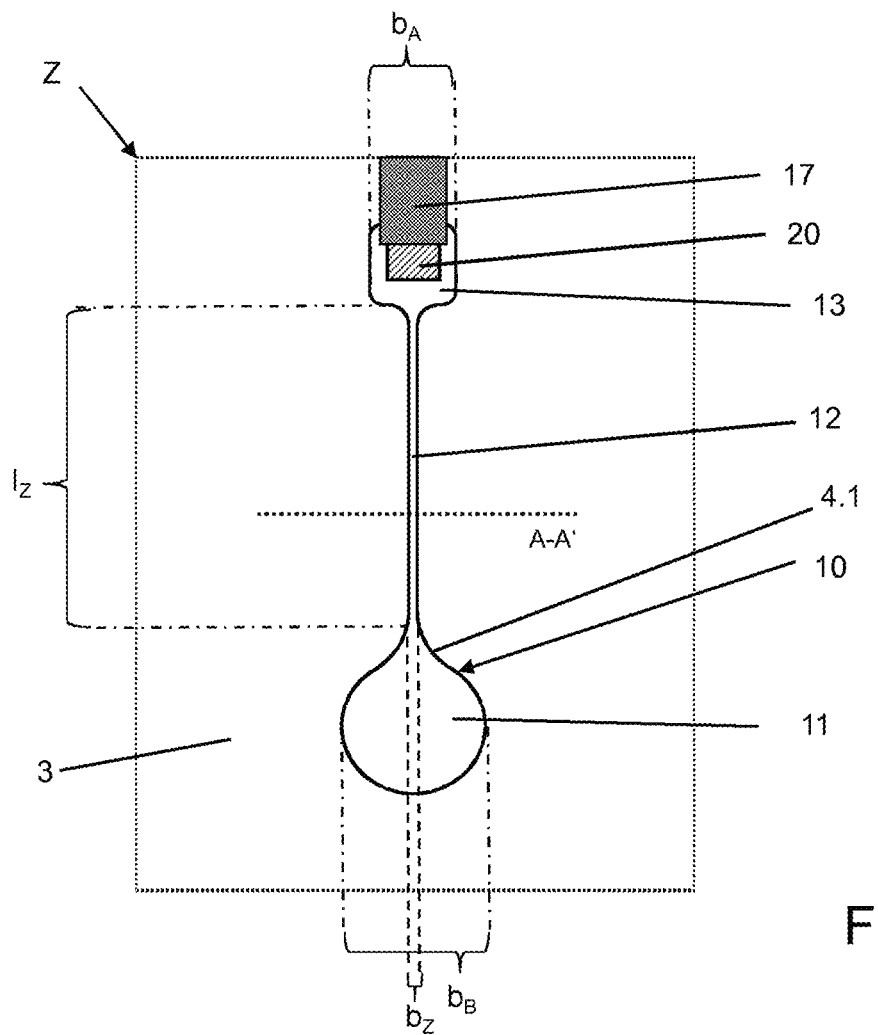
Figure 1C:
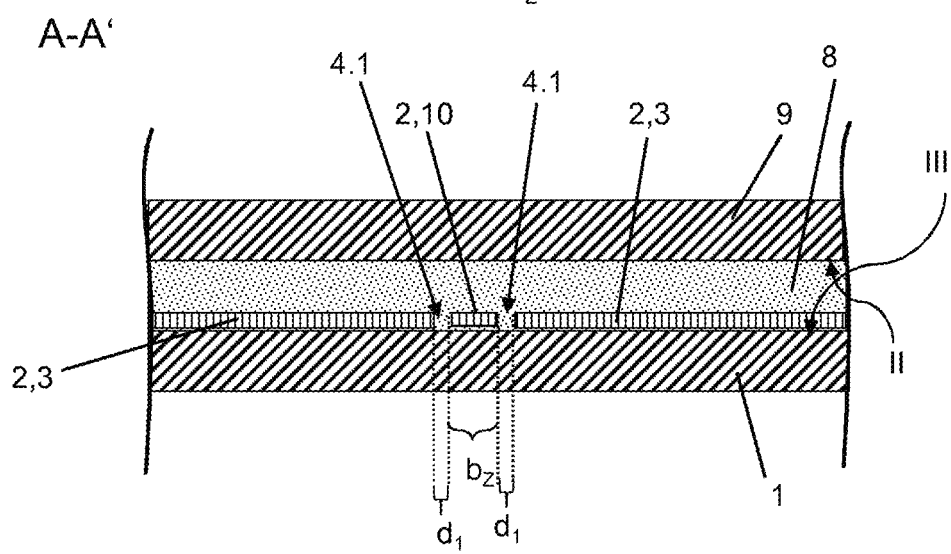
Figure 1D:
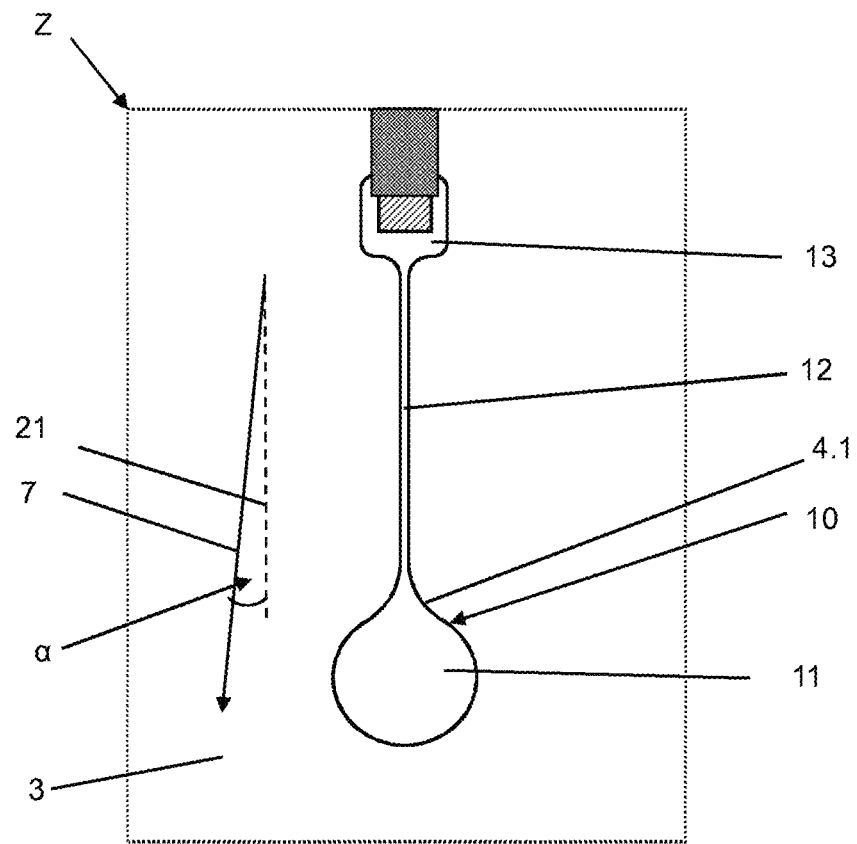
Figure 2A:
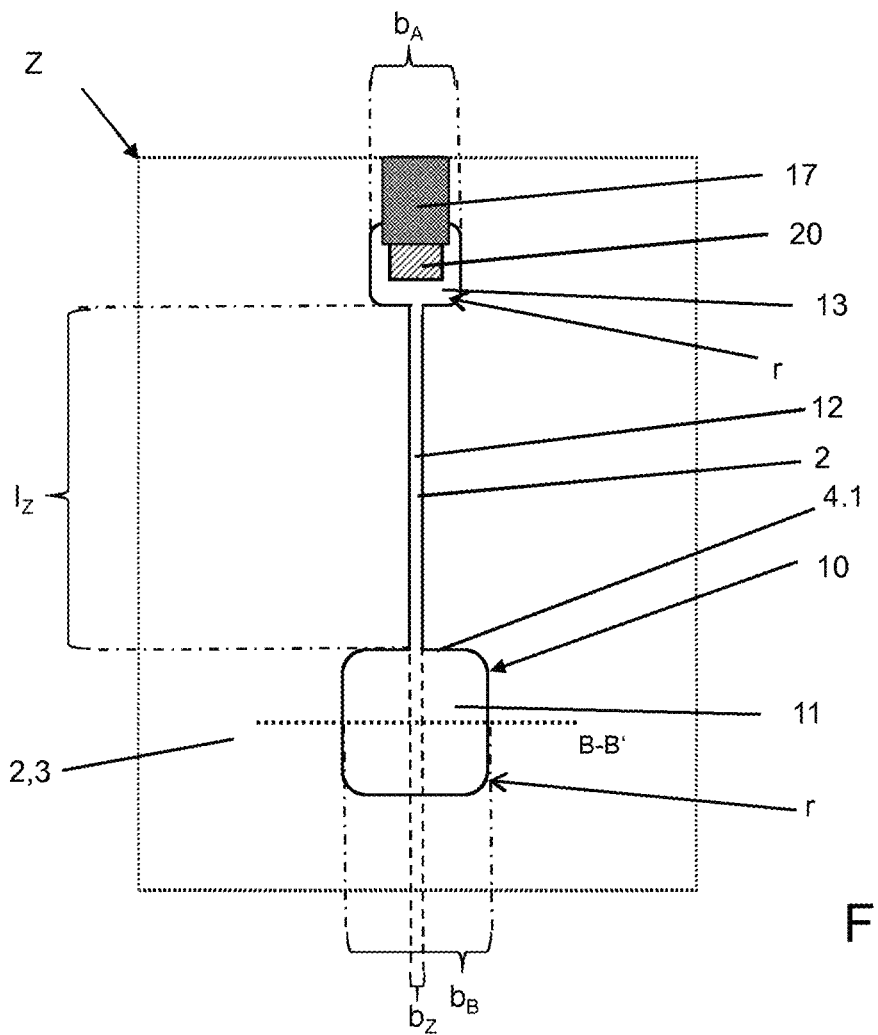
FIG. 2B depicts a cross-sectional view of the embodiment according to FIG. 2A along the cutting line B-B'.
Figure 2B:
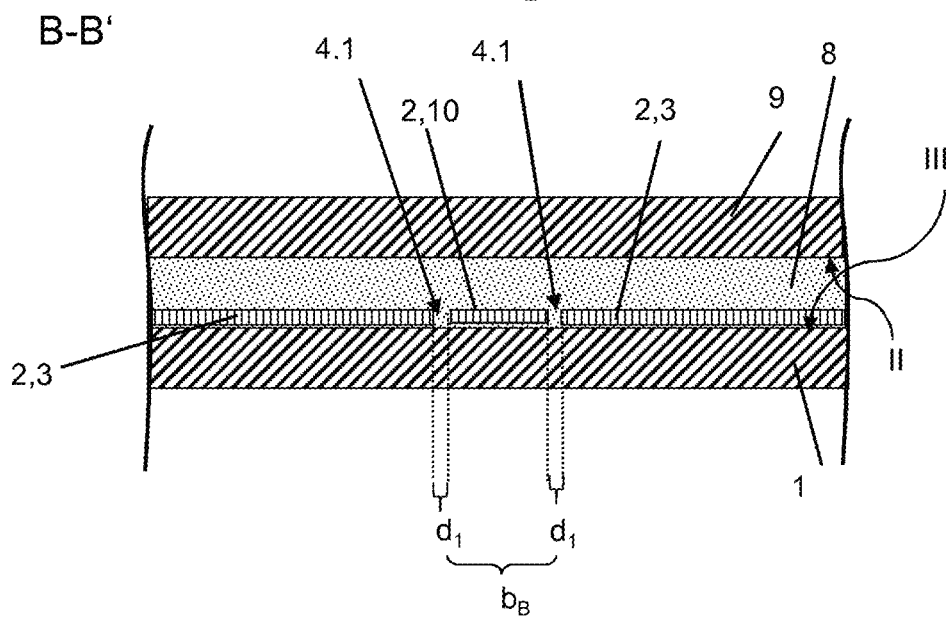
Figure 3:
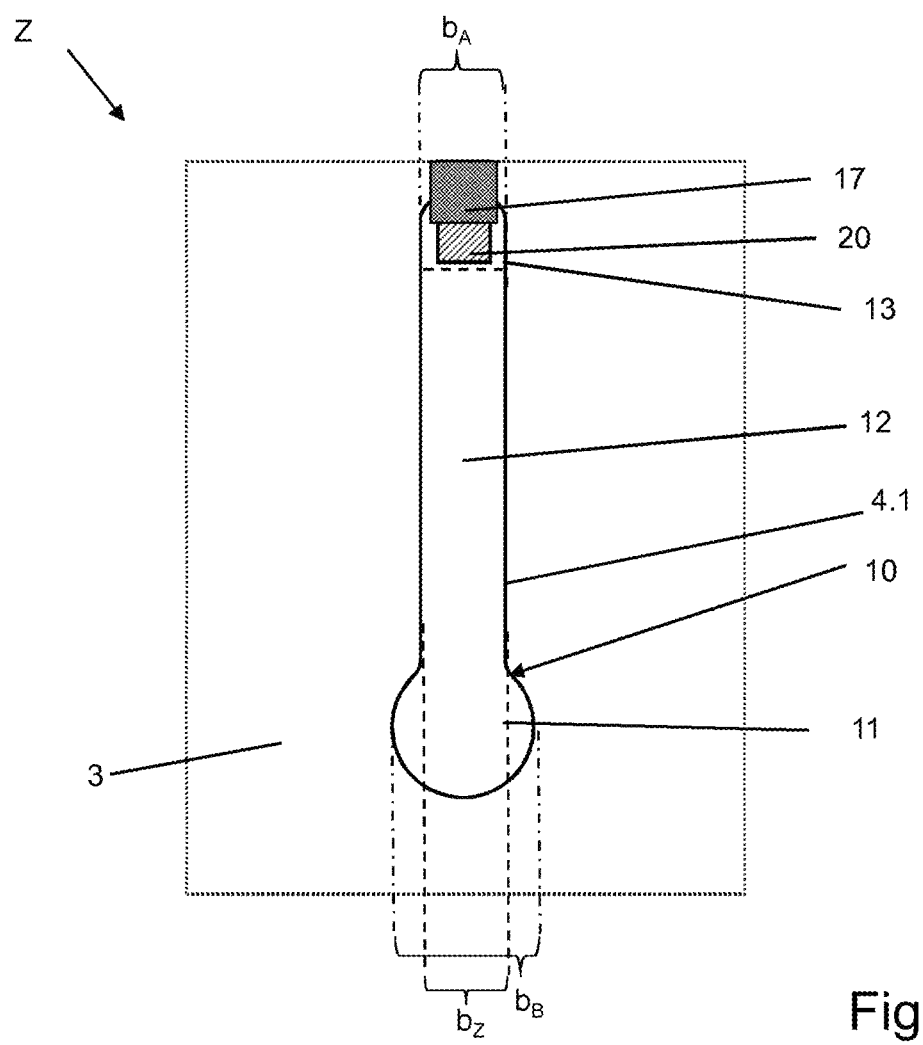
FIG. 3 depicts another alternative embodiment of a pane 100 according to the invention in an enlarged view of the detail Z of FIG. 1A. The exemplary embodiment of the pane 100 corresponds to the pane of FIG. 1A, only with the width $b_Z$ of the contact region implemented wider and being, for example, 30 mm.
Figure 4A:
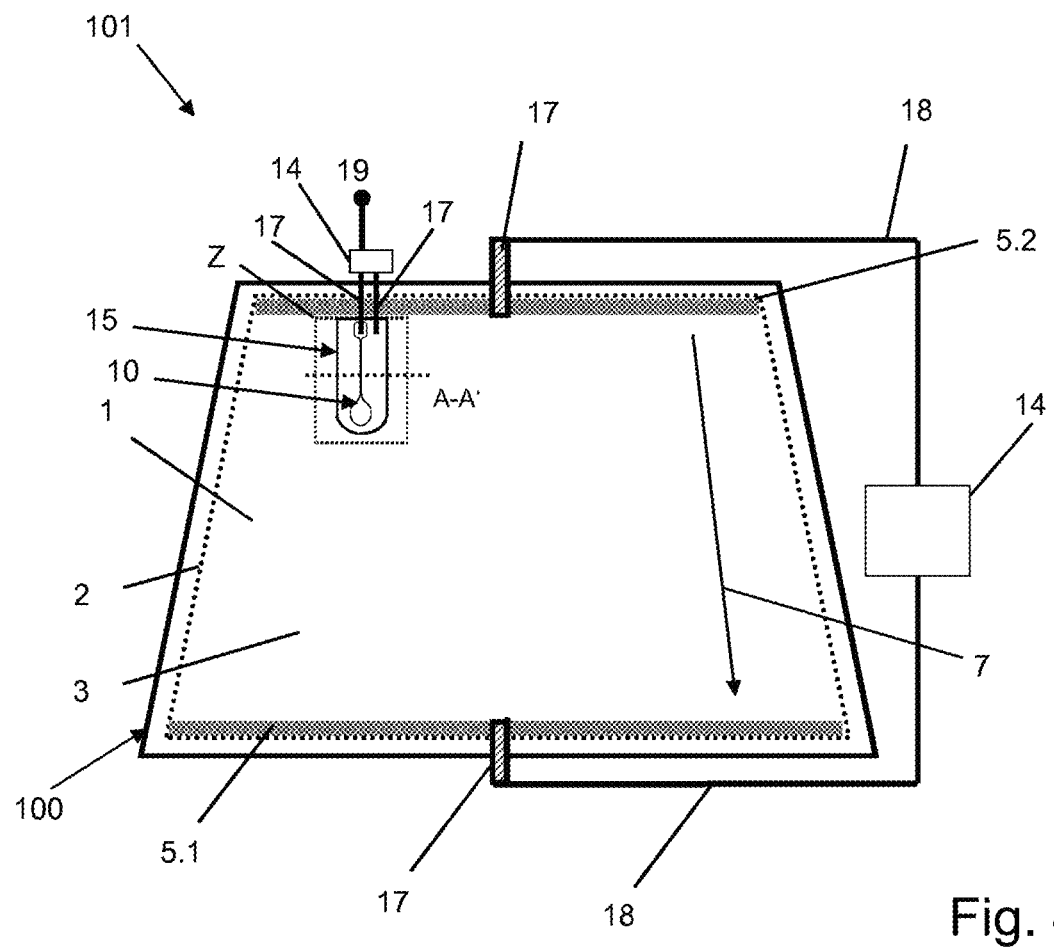

FIG. 4A depicts an alternative embodiment of a pane arrangement 101 according to the invention with a top plan view of a pane 100 according to the invention, wherein the electrically conductive layer 2 has a switch region 10, a heating region 3, and a surrounding region 15. Otherwise, the pane 100 of this exemplary embodiment corresponds, for example, to the pane 100 of FIG. 1A.

Figure 4B:
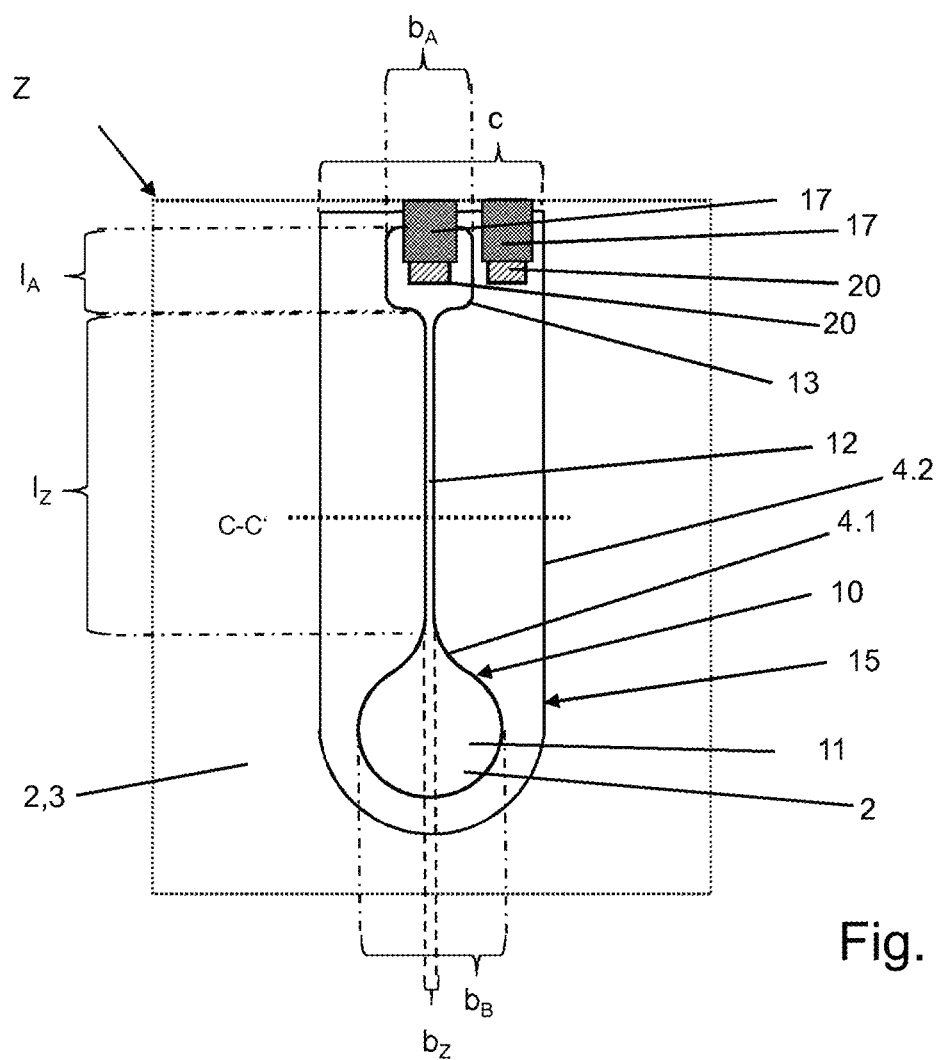

FIG. 4B depicts an enlarged view of the detail Z of FIG. 4A. The surrounding region 15 is formed by the region between the separating line 4.1 and another separating line 4.2 that electrically divides the surrounding region 15 from the heating region 3.

Figure 4C:
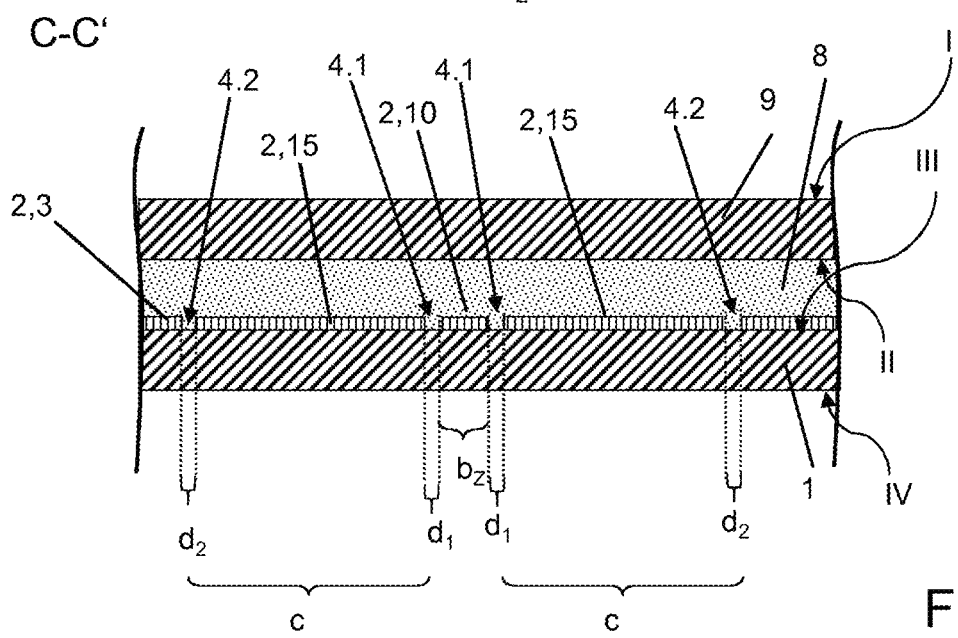

FIG. 4C depicts a cross-sectional view along the cutting line C-C' of FIG. 4B. The switch region 10, the surrounding region 15, and the heating region 3 are all regions of the electrically conductive layer 2 electrically isolated from each other.

The separating lines 4.1,4.2 have a width of, for example, only 100 μm and are introduced into the electrically conductive layer 2, for example, by laser patterning. Separating lines 4.1,4.2 with such a small width are hardly perceptible visually and disrupt vision through the pane 100 only little, which is, especially for use in motor vehicles, of particular importance for driving safety.

The width c of the surrounding region 15 is, for example, 60 mm and completely surrounds the switch region 10. Such a surrounding region 15 is particularly advantageous since it increases the distance between the switch region 10 and the heating region 3 and thus enables precise measurement of the capacitance of the switch region 10. At the same time, because of it, the capacitance measurement is influenced less by the flow of current through the heating region 3.

The surrounding region 15 can, as depicted here, have a connection point that is connected via an electrical line collection 20 to a foil conductor 17. This enables the connection of sensor electronics with two inputs, for example, for differential measurement of a capacitance change between the switch region 10 and the surrounding region 15. This is particularly advantageous for precise measurement of capacitance differences.

Figure 5:
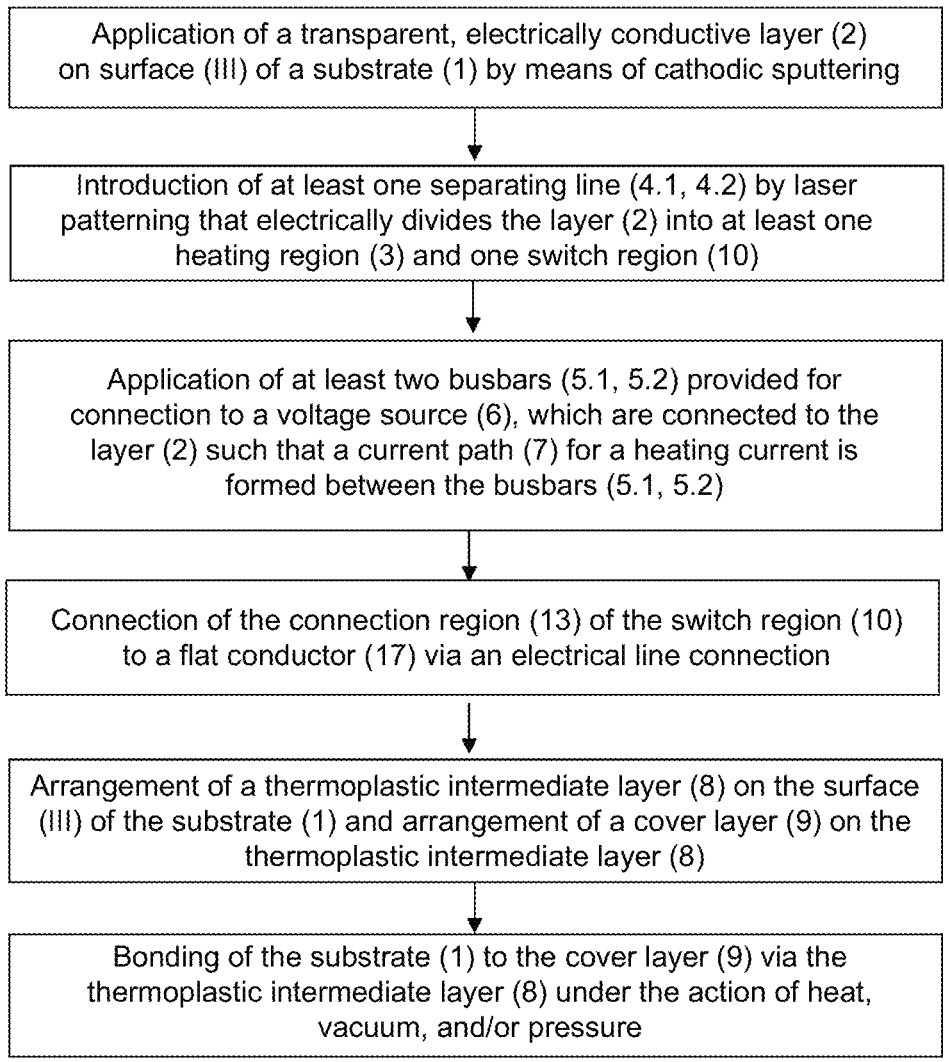

FIG. 5 depicts a flowchart of an exemplary embodiment of the method according to the invention for producing an electrically heatable pane 100 with a switch region 10.

The pane 100 according to the invention in accordance with FIGS. 1-4 has a switch region 10, which can, for example, be connected to capacitive sensor electronics 14. At the same time, the pane 100 has an electrically heatable heating region 3, wherein the heating function and heating power distribution is only slightly impaired or not all impaired by the switch region 10. Moreover, due to the small width of the separating lines 4.1,4.2, vision through the pane is only minimally impaired and satisfies, for example, the requirements for motor vehicle glazing.

Particularly advantageous and surprising is a pane arrangement 101 with a composite pane in which the sensitivity of the sensor electronics 14 is coordinated with the geometry and the dimensions of the switch region 10 such that a selective triggering of the switching operation is only possible from one side of the pane 100.

This result was unexpected and surprising for the person skilled in the art.

LIST OF REFERENCE CHARACTERS 1 substrate, transparent substrate
2 layer, transparent, electrically conductive layer
3 heating region
4.1,4.2 separating line
5.1,5.2 busbar
6 voltage source
7 current path
8 intermediate layer
9 cover pane, transparent cover pane
10 switch region
11 contact region
12 feed line region
13 connection region
14 sensor electronics, capacitive sensor electronics
15 surrounding region
16 additional connection region
17 foil conductor
18 feed line
19 connection point CAN bus
20 electrical line connection
21 direction of the feed line region 12
α angle between current direction 7 and direction of the feed line region 12
c width of the surrounding region 15
$b_A$ width of the connection region 13

$b_B$ width of the contact region 11
$b_Z$ width of the feed line region 12
$d_1, d_2$ width of the separating line 4.1, 4.2
r radius of curvature
$l_A$ length of the connection region 13
$l_B$ length of the contact region 11
$l_Z$ length of the feed line region 12
A-A' cutting line
B-B' cutting line
C-C' cutting line
Z detail

The invention claimed is:

1. An electrically heatable pane with a switch region, comprising:
    a transparent substrate with a surface,
    at least one transparent and electrically conductive layer arranged on at least a part of the surface,
    at least one separating line that electrically divides the electrically conductive layer into a heating region and a switch region, and
    at least two busbars provided for connection to a voltage source that are connected to the heating region to form a current path for a heating current between the busbars,
    wherein:
    the switch region comprises at least one contact region, a feed line region, and a connection region,
    the at least one contact region, the feed line region, and the connection region are contiguous regions of the electrically conductive layer,
    the feed line region electrically connects the at least one contact region to the connection region,
    the connection region is adapted to be electrically connected to sensor electronics, and an area of the contact region is from 1 cm² to 200 cm² and/or a width of the at least one separating line is from 30 µm to 200 µm, and
    at least one additional separating line electrically divides the electrically conductive layer into a surrounding region that completely surrounds the switch region, and wherein the surrounding region has an additional connection region adapted to be connected to the sensor electronics.

2. The electrically heatable pane according to claim 1, wherein the feed line region has a length of 1 cm to 70 cm, and has a width of 0.5 mm to 10 mm.

3. The electrically heatable pane according to claim 1, wherein an angle a between the current path and a longitudinal direction of the feed line region is from 0° to 45°.

4. The electrically heatable pane according to claim 1, wherein the connection region is arranged according to one of:
    a) at an edge of the pane, and b) adjacent to one of the busbars.

5. The electrically heatable pane according to claim 1, wherein the surrounding region has the same or a similar shape as the switch region and is implemented in a shape comprising one of: a) a circle, b) an ellipse, c) a drop, and d) a strip with rounded corners.

6. The electrically heatable pane according to claim 1, wherein the surface of the substrate is connected to a cover pane via a thermoplastic intermediate layer in a planar manner.

7. The electrically heatable pane according to claim 1, wherein at least one of the substrate and the cover pane contains one or a mixture of: a) glass, and b) polymers.

8. The electrically heatable pane according to claim 1, wherein the electrically conductive layer has a sheet resistance of 0.4 ohm/square to 10 ohm/square.

9. A pane arrangement comprising:
    the electrically heatable pane according to claim 6, and
    sensor electronics electrically connected to the connection region of the electrically heatable pane,
    wherein sensitivity of the sensor electronics is selected so as to output:
    i) a first switching signal when the at least one contact region of the electrically heatable pane is touched on the substrate by a human finger, and
    ii) no switching signal or a second switching signal, different from the first switching signal, when the at least one contact region is touched on the cover pane of the electrically heatable pane.

10. A pane arrangement comprising:
    the electrically heatable pane according to claim 6, and
    sensor electronics electrically connected to the connection region of the electrically heatable pane,
    wherein sensitivity of the sensor electronics is selected so as to output:
    i) a first switching signal when the at least one contact region is touched on at least one of the substrate and the cover pane by human finger, and
    ii) no switching signal or a second switching signal, different from the first switching signal, when the feed line region is touched on the substrate and/or the cover pane,
    wherein the connection region of the electrically heatable pane is connected to a flat conductor.

11. The electrically heatable pane according to claim 1, wherein the feed line region has a length of 1 cm to 8 cm and has a width of 0.5 mm to 2 mm.

12. The electrically heatable pane according to claim 2, wherein the feed line region has a shape of a rectangle, a strip, or a line.

13. The electrically heatable pane according to claim 1, wherein an angle a between the current path and a longitudinal direction of the feed line region is from 0° to 20°.

14. The electrically heatable pane according to claim 1, wherein the feed line region has a length and a width, and wherein a ratio of the length to the width is less than or equal to 1:700.

15. The electrically heatable pane according to claim 4, wherein a distance from the connection region to one of a) and b) is less than, or equal to, 10 cm.

16. The electrically heatable pane according to one of claim 1, wherein the contact region has a shape according to one of: a) a circle, b) an ellipse, c) a drop, and d) rounded corners.

17. The electrically heatable pane according to claim 1, wherein a width of the at least one separating line is from 70 µm to 140 µm.

18. The electrically heatable pane according to claim 6, wherein the thermoplastic intermediate layer has a permittivity number from 2 to 4.

19. The electrically heatable pane according to claim 7,
    wherein a) comprises one or more of: a1) flat glass, a2) float glass, a3) quartz glass, a4) borosilicate glass, and a5) soda lime glass, and
    wherein b) comprises one or more of: b1) polyethylene, b2) polypropylene, b3) polycarbonate, and b4) polymethyl methacrylate.

20. The electrically heatable pane according to claim 1, wherein the electrically conductive layer has a sheet resistance of 0.5 ohm/square to 1 ohm/square.

21. The electrically heatable pane according to claim 2, wherein the electrically conductive layer comprises of one more of: a) silver (Ag), b) indium tin oxide (ITO), c) fluorine-doped tin oxide (SnO2:F), and d) aluminumdoped zinc oxide (ZnO:AI).

22. A pane arrangement comprising the electrically heatable pane according to claim 10, wherein the connection region of the electrically heatable pane is connected to a flat conductor, and wherein the flat conductor is guided out of the electrically heatable pane.

23. A method for producing the electrically heatable pane according to claim 1, the method comprising:
   applying a transparent electrically conductive layer on a surface of a transparent substrate;
   forming at least one separating line that electrically divides the transparent electrically conductive layer into at least one heating region and one switch region; and
   connecting at least two busbars to the transparent electrically conductive layer for connection to a voltage source, thereby forming a current path for a heating current between the at least two busbars.

* * * * *